US012640660B2

(12) United States Patent (10) Patent No.: US 12,640,660 B2

He et al. (45) Date of Patent: May 26, 2026

(54) POWER MODULE AND ELECTRICAL DEVICE

(71) Applicant: BYD COMPANY LIMITED, Shenzhen (CN)

(72) Inventors: Yongbin He, Shenzhen (CN); Bing Han, Shenzhen (CN); Alain Yves Louis, Shenzhen (CN); Ruixing He, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 261 days.

(21) Appl. No.: 18/610,035

(22) Filed: Mar. 19, 2024

(65) Prior Publication Data

US 2024/0235414 A1 Jul. 11, 2024

Related U.S. Application Data

(63) Continuation of application No. PCT/CN2022/131801, filed on Nov. 15, 2022.

(30) Foreign Application Priority Data

Nov. 26, 2021 (CN) .......................... 202111423173.0

(51) Int. Cl.
*H05K 1/11* (2006.01)
*H02M 7/00* (2006.01)
(Continued)

(52) U.S. Cl.
CPC .............. *H02M 7/003* (2013.01); *H05K 1/09* (2013.01); *H05K 1/111* (2013.01); *H05K 1/181* (2013.01)

(58) Field of Classification Search
CPC ......... H02M 7/003; H05K 1/09; H05K 1/111; H05K 1/181
(Continued)

(56) References Cited

U.S. PATENT DOCUMENTS 3,463,970 A 8/1969 Gutzwiller
8,064,234 B2 * 11/2011 Tokuyama ......... H05K 7/20927
363/141

(Continued)

FOREIGN PATENT DOCUMENTS

CN 102549744 A 7/2012
CN 104038085 A 9/2014
(Continued)

OTHER PUBLICATIONS

Examination Report No. 1 dated Oct. 22, 2024, issued in related Australian Patent Application No. 2022398012 (3 pages).
(Continued)

*Primary Examiner* — Binh B Tran
(74) *Attorney, Agent, or Firm* — Sheppard Mullin Richter & Hampton LLP

(57) ABSTRACT

A power supply includes: a housing; a first bridge arm assembly and a second bridge arm assembly disposed in the housing; and an insulating member disposed between the first bridge arm assembly and the second bridge arm assembly. The first bridge arm assembly has an alternating current terminal, and the second bridge arm assembly has a direct current terminal. A projection of the alternating current terminal on a plane on which the direct current terminal is located at least partially overlaps the direct current terminal. At least a part of the insulating member is disposed between the alternating current terminal and the direct current terminal.

20 Claims, 11 Drawing Sheets

(51) Int. Cl.
H05K 1/09          (2006.01)
H05K 1/181         (2026.01)

(58) Field of Classification Search
USPC ........................................................ 361/748
See application file for complete search history.

(56)                    References Cited

U.S. PATENT DOCUMENTS

| | | | | |
|---|---|---|---|---|
| 8,659,130 | B2 * | 2/2014 | Takagi | ................ H01L 23/3675 |
| | | | | 257/713 |
| 2007/0096278 | A1 * | 5/2007 | Nakatsu | .............. H01L 23/3675 |
| | | | | 257/E23.098 |
| 2008/0122075 | A1 | 5/2008 | Bauer et al. | |
| 2013/0241043 | A1 | 9/2013 | Kato et al. | |
| 2017/0194200 | A1 * | 7/2017 | Bayerer | ........... H01L 21/76838 |
| 2021/0057372 | A1 | 2/2021 | Oh et al. | |

FOREIGN PATENT DOCUMENTS

| | | |
|---|---|---|
| CN | 106716813 A | 5/2017 |
| CN | 109412430 A | 3/2019 |
| CN | 111540730 A | 8/2020 |
| CN | 111554645 A | 8/2020 |
| CN | 112335043 A | 2/2021 |
| CN | 212543672 U | 2/2021 |
| CN | 112736038 A | 4/2021 |
| CN | 110323142 B | 8/2021 |
| CN | 113412539 A | 9/2021 |
| JP | 2007-053295 A | 3/2007 |
| JP | 2013-219290 A | 10/2013 |
| JP | 2019-140236 A | 8/2019 |
| WO | 2021100191 A1 | 5/2021 |
| WO | 2021200166 A1 | 10/2021 |

OTHER PUBLICATIONS

Office Action dated Mar. 14, 2025, issued in related Canadian Patent Application No. 3,233,289 (5 pages).
Extended European Search Report dated Feb. 26, 2025, issued in related European Patent Application No. 22897645.2 (16 pages).
Notice of Reasons for Refusal dated Mar. 18, 2025, issued in related Japanese Patent Application No. 2024-515907, with English machine translation (13 pages).
Decision of Refusal dated Jul. 15, 2025, issued in related Japanese Patent Application No. 2024-515907, with English machine translation (16 pages).
Request for the Submission of an Opinion dated May 2, 2025, issued in related Korean Patent Application No. 10-2024-7008352, with English machine translation (13 pages).
Notification of grant of patent right for invention for Chinese Application No. 202111423173.0 mailed on Jul. 22, 2024.
Partial Supplemental European Search Report for European Application No. 22897645.2 mailed on Dec. 5, 2024.
International Preliminary Report on Patentability Chapter I for International Application No. PCT/CN2022/131801 mailed on Jun. 6, 2024.
International Search Report and Written Opinion for Application No. PCT/CN2022/131801, mailed on Jan. 16, 2023, 8 pages.

* cited by examiner

POWER MODULE AND ELECTRICAL DEVICE

CROSS-REFERENCE TO RELATED APPLICATIONS

The application is a continuation application of International Patent Application No. PCT/CN2022/131801 filed on Nov. 15, 2022, which is based on and claims priority to and benefits of Chinese Patent Application No. 202111423173.0, filed on Nov. 26, 2021. The entire content of all of the above-referenced applications is incorporated herein by reference.

FIELD

The present disclosure relates to the field of electrical and electronic technologies, and more particularly, to a power supply and an electrical device having the power supply.

BACKGROUND

In the related art, a power supply is packaged and fastened by a single-sided direct water-cooled structure, for example, a third-generation semiconductor component like a SiC MOSFET. A problem in this packaging form is that a stray inductance is large, and a high switching loss is likely to be caused. There is a room for improvement.

SUMMARY

The present disclosure resolves at least one of the technical problems existing in the related art. Therefore, the present disclosure provides a power supply. The power supply can effectively resolve a problem that a stray inductance is large, so that operation safety of the power supply is improved.

A power supply according to an embodiment of the present disclosure includes: a housing; a first bridge arm assembly and a second bridge arm assembly disposed in the housing; and an insulating member disposed between the first bridge arm assembly and the second bridge arm assembly. The first bridge arm assembly has an alternating current terminal, the second bridge arm assembly has a direct current terminal, a projection of the alternating current terminal on a plane on which the direct current terminal is located at least partially overlaps the direct current terminal, and at least a part of the insulating member is disposed between the alternating current terminal and the direct current terminal.

According to the power supply in this embodiment of the present disclosure, a structural design in which the alternating current terminal of the first bridge arm assembly and the direct current terminal of the second bridge arm assembly are stacked in an insulative manner enables the power supply to effectively resolve a problem that a stray inductance is large, so that operation accuracy of the power supply is improved.

According to the power supply in some embodiments of the present disclosure, the first bridge arm assembly further includes a first copper layer and a first chip. A projection of the first copper layer on a plane on which the alternating current terminal is located at least partially overlaps the alternating current terminal. The first chip is disposed in the alternating current terminal and faces the first copper layer. The second bridge arm assembly further includes a second copper layer and a second chip. A projection of the second copper layer on the plane on which the direct current terminal is located at least partially overlaps the direct current terminal. The second chip is disposed in the direct current terminal and faces the second copper layer. The first chip and the second chip are staggered in a width direction of the insulating member.

According to the power supply in some embodiments of the present disclosure, a first pad block is disposed between the first chip and the second copper layer, and adjacent two of the first copper layer, the first chip, the first pad block, and the second copper layer are welded by a first welding layer. A second pad block is disposed between the second chip and the first copper layer, and adjacent two of the second copper layer, the second chip, the second pad block, and the first copper layer are welded by a second welding layer.

According to the power supply in some embodiments of the present disclosure, each of the direct current terminal and the alternating current terminal includes a platelike structure. The alternating current terminal is connected to the first copper layer. The direct current terminal is connected to the second copper layer.

According to the power supply in some embodiments of the present disclosure, the first bridge arm assembly further includes a first circuit board and an alternating current control terminal. The first circuit board is electrically connected between the first chip and the alternating current control terminal. The alternating current control terminal extends out of the housing. The second bridge arm assembly further includes a second circuit board and a direct current control terminal. The second circuit board is electrically connected between the second chip and the direct current control terminal. The direct current control terminal extends out of the housing.

According to the power supply in some embodiments of the present disclosure, the alternating current control terminal and the direct current control terminal are integrated as a control board.

According to the power supply in some embodiments of the present disclosure, each of the alternating current control terminal and the direct current control terminal includes a control board.

According to the power supply in some embodiments of the present disclosure, the direct current terminal includes a positive terminal and a negative terminal that are spaced apart. The second circuit board has a capacitance absorption region. Two ends of the capacitance absorption region are electrically connected to the negative terminal and the positive terminal respectively.

According to the power supply in some embodiments of the present disclosure, a temperature sensor is disposed on the first circuit board and/or the second circuit board.

According to the power supply in some embodiments of the present disclosure, the direct current terminal includes the positive terminal and the negative terminal. The positive terminal and the negative terminal are spaced apart, and a projection of each of the positive terminal and the negative terminal on the plane on which the alternating current terminal is located overlaps the alternating current terminal.

According to the power supply in some embodiments of the present disclosure, both the positive terminal and the negative terminal are located on a first side of the insulating member, the positive terminal is located on a first part of the insulating member, the negative terminal is located on a second part of the insulating member, and the alternating current terminal is located on a second side of the insulating member.

According to the power supply in some embodiments of the present disclosure, the insulating member includes a first insulating layer and a second insulating layer. The positive terminal is located on a first side of the alternating current terminal. The first insulating layer is disposed between the positive terminal and the alternating current terminal. The negative terminal is located on a second side of the alternating current terminal. The second insulating layer is disposed between the negative terminal and the alternating current terminal.

According to the power supply in some embodiments of the present disclosure, the insulating member includes the first insulating layer and the second insulating layer. The positive terminal, the first insulating layer, the negative terminal, the second insulating layer, and the alternating current terminal are sequentially disposed. In an embodiment, the negative terminal, the first insulating layer, the positive terminal, the second insulating layer, and the alternating current terminal are sequentially disposed.

According to the power supply in some embodiments of the present disclosure, both the direct current terminal and the alternating current terminal extend out from a side of the housing. An extension length of the alternating current terminal is greater than an extension length of the direct current terminal.

According to the power supply in some embodiments of the present disclosure, the direct current terminal includes the positive terminal and the negative terminal. An absorption capacitor is disposed between the positive terminal and the negative terminal.

The present disclosure further provides an electrical device.

The electrical device according to an embodiment of the present disclosure includes the power supply according to any of the foregoing embodiments.

Compared with the related art, the electrical device has same advantages as the foregoing power supply. Details are not described herein again.

Some of additional aspects and advantages of the present disclosure are given in the following description, and some of which become clear from the following description or may be learned from practices of the present disclosure.

BRIEF DESCRIPTION OF THE DRAWINGS

The foregoing and/or additional aspects and advantages of the present disclosure become clear and comprehensible in the description of the embodiments made with reference to the following accompanying drawings.

Figure 1:
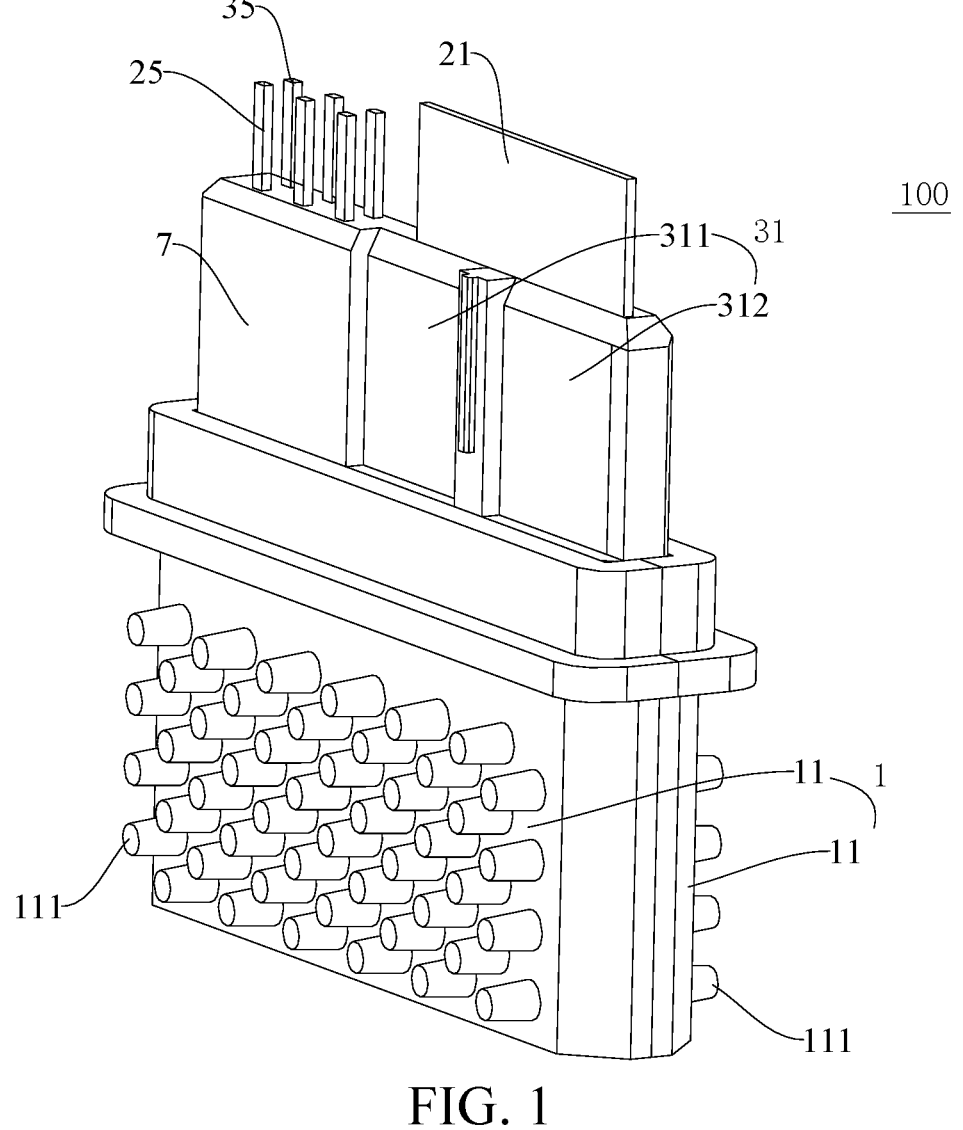
FIG. 1 is a schematic structural diagram of a power supply according to an embodiment of the present disclosure.

REFERENCE NUMERALS power supply 100, housing 1, sub-housing 11, pin-fin structure 111, first bridge arm assembly 2, alternating current terminal 21, first copper layer 22, first chip 23, first circuit board 24, alternating current control terminal 25, second bridge arm assembly 3, direct current terminal 31, positive terminal 311, negative terminal 312, second copper layer 32, positive copper layer region 321, negative copper layer region 322, second chip 33, second circuit board 34, direct current control terminal 35, control board 41, connection point 42, capacitance absorption region 43, positive capacitance region 431, negative capacitance region 432, welding block 433, temperature sensor 44, absorption capacitor 45, pad 46, first pad block 51, first welding layer 52, second pad block 61, second welding layer 62, insulating member 7, first insulating layer 71, second insulating layer 72, and ceramic layer 8.

DETAILED DESCRIPTION

The following describes in detail embodiments of the present disclosure, examples of the embodiments are shown in the accompanying drawings, and identical or similar reference numerals represent identical or similar elements or elements having identical or similar functions. The following embodiments described with reference to the accompanying drawings are examples, and are merely to explain the present disclosure, but should not be construed as a limitation on the present disclosure.

A power module or a power supply 100 according to embodiments of the present disclosure is described below with reference to FIG. 1 to FIG. 21. The power supply 100 uses a structural design in which a direct current terminal 31 and an alternating current terminal 21 are distributed/disposed in a stacked manner, so that the power supply 100 can effectively resolve a problem of a large stray inductance, and improve operation accuracy of the power supply 100.

Figure 2:
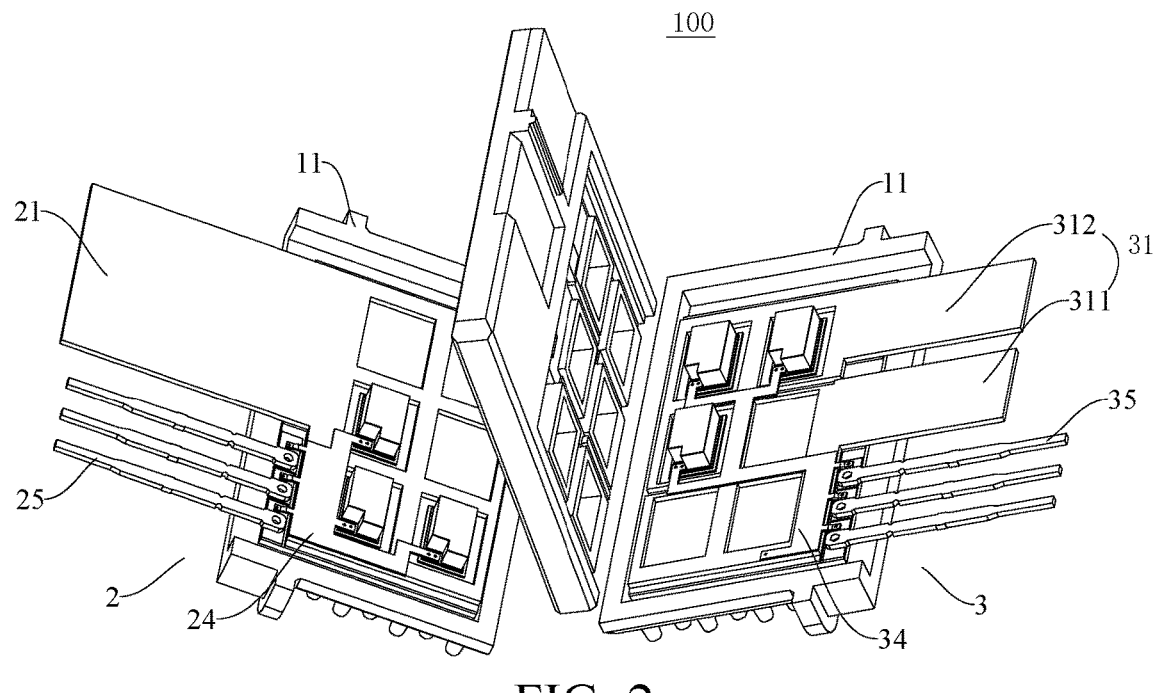
FIG. 2 is an assembly view of a power supply according to an embodiment of the present disclosure.
Figure 3:
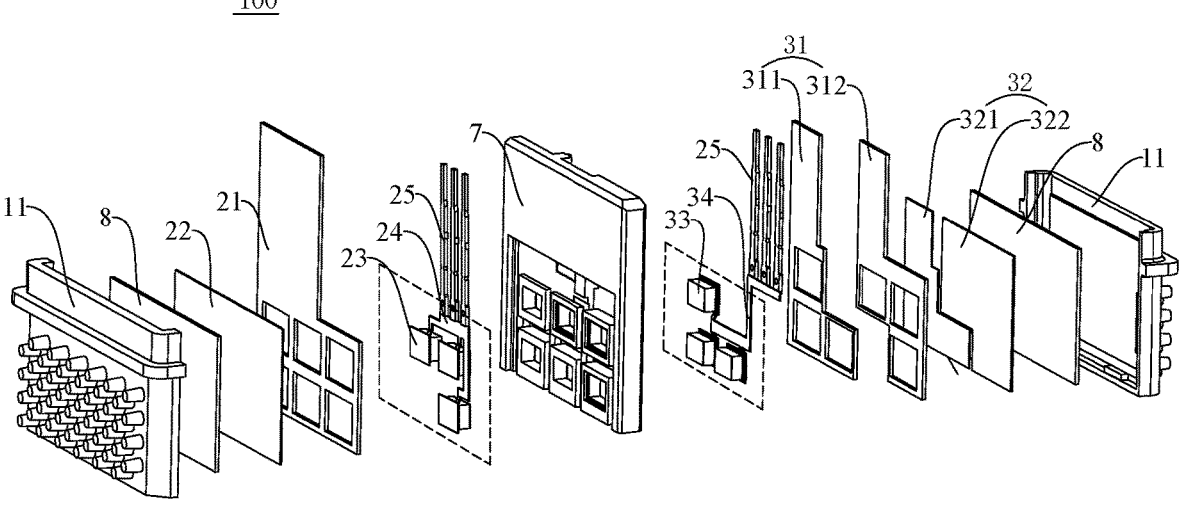
FIG. 3 is an exploded view of a power supply according to an embodiment of the present disclosure.

As shown in FIG. 1 to FIG. 3, the power supply 100 according to embodiments of the present disclosure includes a housing 1, a first bridge arm assembly 2, and a second bridge arm assembly 3.

It should be noted that, as shown in FIG. 1, the housing 1 is an external housing structure of the power supply 100, to protect and fasten an element installed in the housing 1. In addition, a heat dissipation structure is arranged/disposed on each of two opposite outer side surfaces of the housing 1. As shown in FIG. 1 and FIG. 2, multiple pin-fin structures 111 are used on each outer side surface of the housing 1, to achieve a cooling effect for a large heat dissipation area. This improves a heat dissipation function for the element.

The first bridge arm assembly 2 and the second bridge arm assembly 3 are installed/disposed in the housing 1. The inside of the housing 1 is a hollow structure, to form an installation cavity in the housing 1. The installation cavity has an opening, so that both the first bridge arm assembly 2 and the second bridge arm assembly 3 are installed in the installation cavity. An alternating current terminal 21 of the first bridge arm assembly 2 and a direct current terminal 31 of the second bridge arm assembly 3 may extend out from the opening. The first bridge arm assembly 2 and the second bridge arm assembly 3 are oppositely arranged/disposed in the installation cavity, and an insulating member 7 is formed between the first bridge arm assembly 2 and the second bridge arm assembly 3, so that the insulating member 7 can perform an insulation and separation role between the first bridge arm assembly 2 and the second bridge arm assembly 3. In this way, relative positions of internal elements of the first bridge arm assembly 2 and the second bridge arm assembly 3 are fixed, both the first bridge arm assembly 2 and the second bridge arm assembly 3 are stable, and the insulating member 7 can effectively prevent an accidental short circuit between the first bridge arm assembly 2 and the second bridge arm assembly 3, so that the operation safety of the first bridge arm assembly 2 and the second bridge arm assembly 3 is improved.

During the actual design, the housing 1 may have an integral structure. In an embodiment, as shown in FIG. 2 and FIG. 3, the housing 1 may include two sub-housings 11. The side surfaces of the two sub-housings 11 that face each other are concave structures, so that the housing 1 is formed after the two sub-housings 11 are spliced and fastened, and the installation cavity is formed between the two sub-housings 11. The first bridge arm assembly 2 may be first installed in a sub-housing 11, and the second bridge arm assembly 3 may be first installed in the other sub-housing 11. In this way, as shown in FIG. 2, the first bridge arm assembly 2 and the sub-housing 11 form a left part of the power supply 100, and the second bridge arm assembly 3 and the other sub-housing 11 form a right part of the power supply 100. Then, the left part and the right part are spliced together to splice the two sub-housings 11 into a whole. The first bridge arm assembly 2 and the second bridge arm assembly 3 are oppositely arranged (e.g., facing each other) between the two sub-housings 11. An installation gap formed between the first bridge arm assembly 2 and the second bridge arm assembly 3 may be used as an injection molding space, to pot thermosetting resin in the injection molding space, so that the thermosetting resin forms the insulating member 7 between the first bridge arm assembly 2 and the second bridge arm assembly 3 after solidification. In this way, fastening and packaging can be achieved, and insulation and protection can be achieved. The two sub-housings 11 may form an integral sealed cavity through a process such as brazing, laser welding, or stir welding. During the welding, a pressure may be applied to the sub-housings 11, so that the stress is retained to maintain the reliable impact of an electrical connection point of an internal chip after the welding is completed. After the housing 1 is welded, reflow soldering may be performed to melt and bond solder in the module.

After the power supply 100 is packaged and fastened, side surfaces of the two sub-housings 11 that face away from each other have pin-fin structures 111, so that the two sub-housings 11 can respectively perform a heat dissipation and cooling role on side surfaces of the first bridge arm assembly 2 and the second bridge arm assembly 3 that face away from each other.

As shown in FIG. 1 to FIG. 3, the first bridge arm assembly 2 has the alternating current terminal 21, and the second bridge arm assembly 3 has the direct current terminal 31. The alternating current terminal 21 and the direct current terminal 31 are used as power terminals of the power supply 100, to input or output a current, and ensure that the power supply 100 can operate normally. The alternating current terminal 21 and the direct current terminal 31 may be designed into a flat structure, and the alternating current terminal 21 and the direct current terminal 31 may be made of a copper material, so that the alternating current terminal 21 and the direct current terminal 31 (which are not in direct contact) can be distributed in a space. In an embodiment, a projection of the alternating current terminal 21 on a plane on which the direct current terminal 31 is located at least partially overlaps the direct current terminal 31. In other words, the alternating current terminal 21 and the direct current terminal 31 are oppositely distributed in thickness directions of the alternating current terminal 21 and the direct current terminal 31. In this way, the alternating current terminal 21 and the direct current terminal 31 can be arranged in the power supply 100 together while ensuring the current conduction of the alternating current terminal 21 and the direct current terminal 31, and at least a part of the insulating member 7 can be arranged/disposed between the alternating current terminal 21 and the direct current terminal 31, so that an internal installation space is utilized to a greatest extent, and a current short circuit between the direct current terminal 31 and the alternating current terminal 21 is effectively prevented. In the present disclosure, the at least a part of the insulating member 7 located between the alternating current terminal 21 and the direct current terminal 31 may use an injection molding or filling resin material, or may use a thin-film material made of an insulating material such as a polyimide film or a ceramic insulating sheet. This also facilitates an insulating function between the alternating current terminal 21 and the direct current terminal 31. A thickness of the thin-film material may be designed to be 0.1 mm to 0.3 mm.

In addition, it should be noted that, the alternating current terminal 21 and the direct current terminal 31 are oppositely installed in the power supply 100, and the direct current terminal 31 may include a positive terminal 311 and a negative terminal 312. In this way, after the positive terminal 311, the negative terminal 312, and the alternating current terminal 21 are oppositely distributed/disposed, a stray inductance of the terminal can be reduced. In an embodiment, according to this design, the positive terminal 311, the negative terminal 312, and the alternating current terminal 21 can be closely attached to provide a closest return path for a current, and a commutated current between positive and negative electrodes can induct a reverse current on the closely attached alternating current terminal 21 to reduce an inductance of a commutating circuit, so that a stray inductance is effectively reduced.

According to the power supply 100 in embodiments of the present disclosure, a structural design in which the alternating current terminal 21 of the first bridge arm assembly 2 and the direct current terminal 31 of the second bridge arm assembly 3 are stacked and insulated enables the power supply 100 to effectively resolve a problem of a large stray inductance, so that operation accuracy of the power supply 100 is improved.

Figures 4, 5:
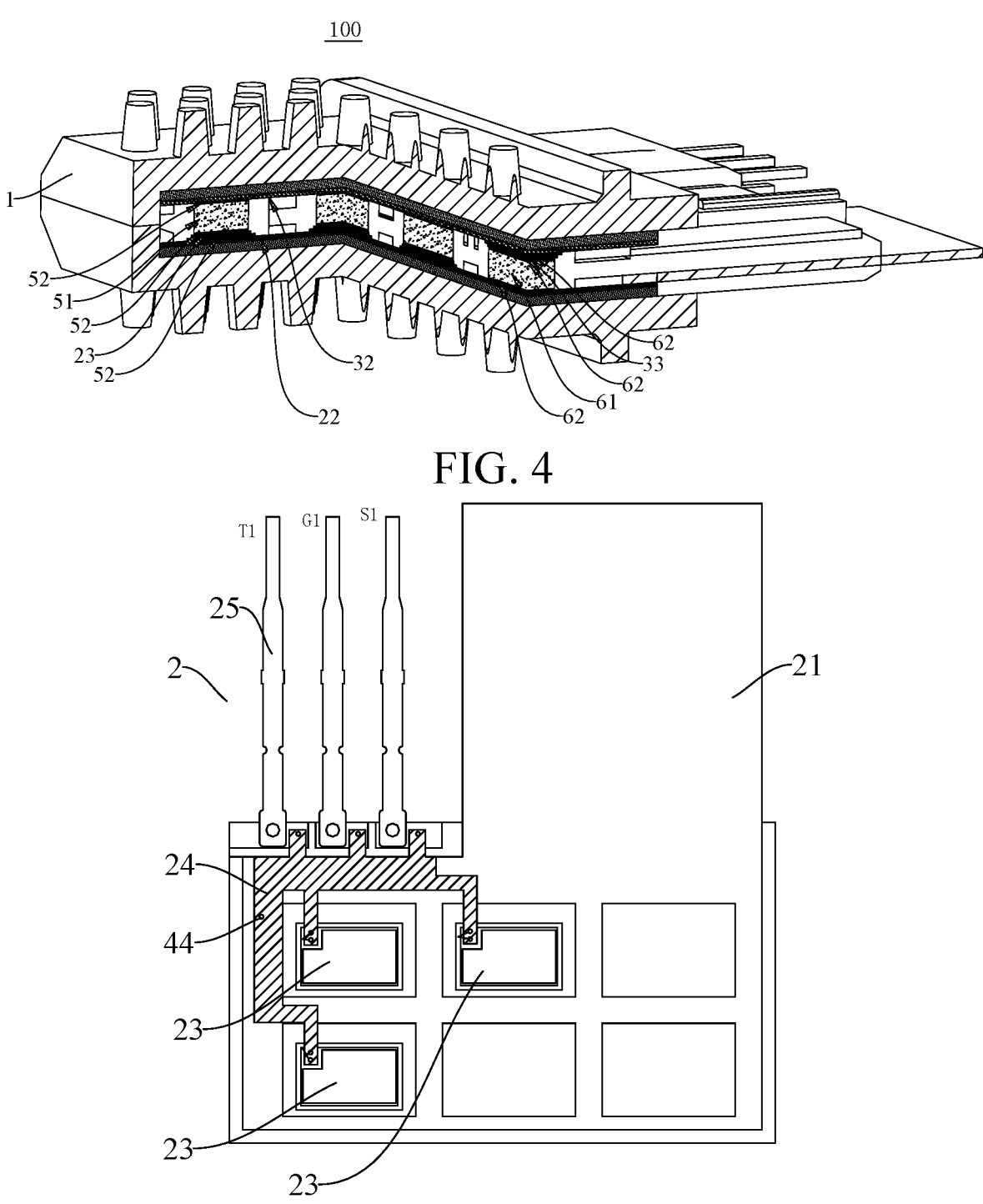
FIG. 4 is a cross-sectional view of a power supply according to an embodiment of the present disclosure.
FIG. 5 is a cross-sectional view of a first bridge arm assembly of a power supply according to an embodiment of the present disclosure.

In some embodiments, as shown in FIG. 3 and FIG. 5, the first bridge arm assembly 2 further includes a first copper layer 22 and a first chip 23. A projection of the first copper layer 22 on a plane on which the alternating current terminal 21 is located at least partially overlaps the alternating current terminal 21, and the first chip 23 is installed in the alternating current terminal 21, so that the first chip 23 is electrically connected to the alternating current terminal 21, and the first chip 23 and the first copper layer 22 are distributed directly facing each other. As shown in FIG. 3 and FIG. 5, a lower part of the alternating current terminal 21 has a groove structure, and the first chip 23 is installed/disposed in the groove structure, so that a relative position between the first chip 23 and the alternating current terminal 21 is fixed. The first copper layer 22 fits the lower part of the alternating current terminal 21 and fits a side surface of the first chip 23, so that the first copper layer 22, the first chip 23, and the alternating current terminal 21 are fastened with respect to each other.

As shown in FIG. 3 and FIG. 5, there are three first chips 23, and the alternating current terminal 21 has three groove structures. The three first chips 23 are correspondingly installed in the three groove structures, so that the three first chips 23 are fastened to the alternating current terminal 21, and the three first chips 23 are distributed/disposed directly facing the first copper layer 22.

Figure 6:
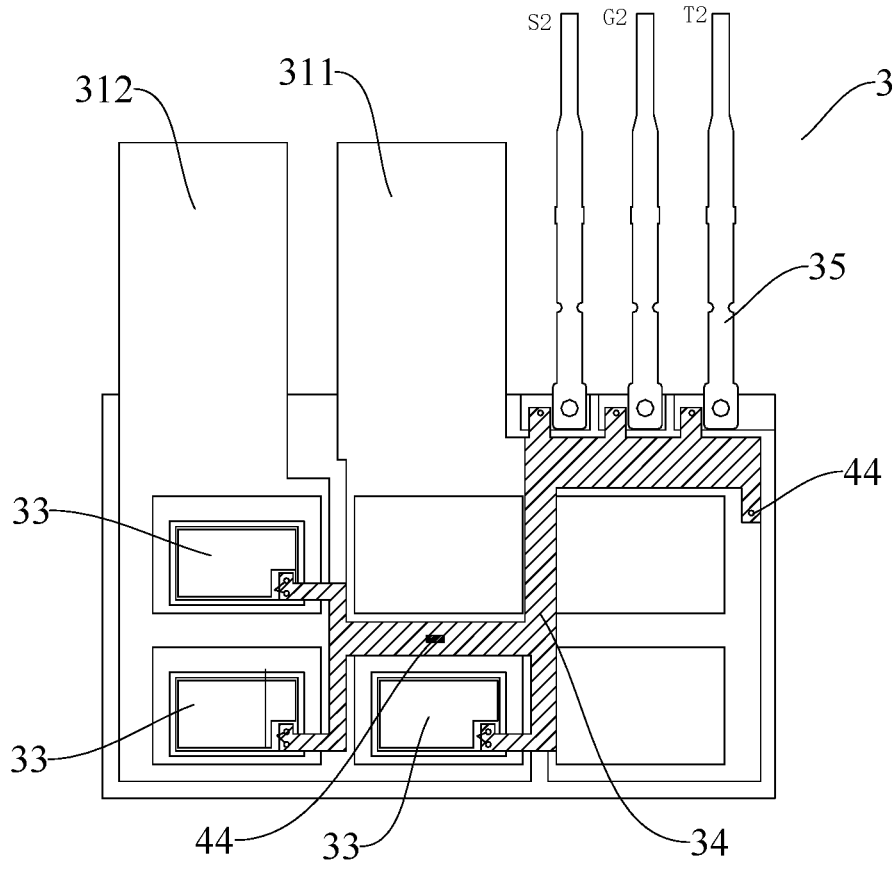
FIG. 6 is a cross-sectional view of a second bridge arm assembly of a power supply according to an embodiment of the present disclosure.

As shown in FIG. 3 and FIG. 6, the second bridge arm assembly 3 further includes a second copper layer 32 and a second chip 33. A projection of the second copper layer 32 on the plane on which the direct current terminal 31 is located at least partially overlaps the direct current terminal 31, and the second chip 33 is installed/disposed in the direct current terminal 31, so that the second chip 33 is electrically connected to the direct current terminal 31, and the second chip 33 and the second copper layer 32 are distributed/disposed directly facing each other. As shown in FIG. 3 and FIG. 6, a lower part of the direct current terminal 31 has a groove structure, and the second chip 33 is installed in the groove structure, so that a relative position between the second chip 33 and the direct current terminal 31 is fixed. The second copper layer 32 fits the lower part of the direct current terminal 31 and fits a side surface of the second chip 33, so that the second copper layer 32, the second chip 33, and the direct current terminal 31 are fastened with each other.

As shown in FIG. 3 and FIG. 6, there are three second chips 33, and the direct current terminal 31 has three groove structures. The three second chips 33 are correspondingly installed in the three groove structures, so that the three second chips 33 are fastened to the direct current terminal 31, and the three second chips 33 are distributed directly facing the second copper layer 32.

In addition, during design, the direct current terminal 31 includes the positive terminal 311 and the negative terminal 312, and the second copper layer 32 includes a positive copper layer region 321 and a negative copper layer region 322. The positive copper layer region 321 and the negative copper layer region 322 are spaced apart. The positive copper layer region 321 is configured to be stacked with the positive terminal 311, and the negative copper layer region 322 is configured to be stacked with the negative terminal 312.

It should be noted that, as shown in FIG. 3, a ceramic layer 8 is arranged/disposed between the first copper layer 22 and a left sub-housing 11, to space the first copper layer 22 from the sub-housing 11 in an insulative manner. In addition, a ceramic layer 8 is arranged between the second copper layer 32 and a right sub-housing 11, to space the second copper layer 32 from the other sub-housing 11 in an insulative manner. In this way, it is ensured that an internal electronic element of the power supply 100 is spaced from the housing 1 in an insulative manner.

In some embodiments, as shown in FIG. 4, a first pad block 51 is arranged/disposed between the first chip 23 and the second copper layer 32, and adjacent two of the first copper layer 22, the first chip 23, the first pad block 51, and the second copper layer 32 are welded and fastened by a first welding layer 52. In other words, when the first bridge arm assembly 2 and the second bridge arm assembly 3 are installed, the first chip 23 may be first installed in the groove structure of the alternating current terminal 21, the first chip 23 and the first copper layer 22 are welded and fastened, and then the first pad block 51 is welded and fastened between the first chip 23 and the second copper layer 32. In this way, adjacent two of the first copper layer 22, the first chip 23, the first pad block 51, and the second copper layer 32 are welded and fastened.

Similarly, as shown in FIG. 4, a second pad block 61 is arranged between the second chip 33 and the first copper layer 22, and adjacent two of the second copper layer 32, the second chip 33, the second pad block 61, and the first copper layer 22 are welded and fastened by a second welding layer 62. In other words, during the installation, the second chip 33 may be first installed in the groove structure of the direct current terminal 31, the second chip 33 and the second copper layer 32 are welded and fastened, and then the second pad block 61 is welded and fastened between the second chip 33 and the first copper layer 22. In this way, adjacent two of the second copper layer 32, the second chip 33, the second pad block 61, and the first copper layer 22 are welded and fastened.

Therefore, the first chip 23 and the second chip 33 in the present disclosure are disposed reversely. This can reduce the usage of bridgeware, so that structure design costs are reduced. In addition, a copper foil arranged at a lower layer is a conducting region, and can provide a smooth return path for a current. This reduces a stray inductance.

In some embodiments, each of the direct current terminal 31 and the alternating current terminal 21 is a platelike structure. In other words, during the molding, each of the positive terminal 311, the negative terminal 312, and the alternating current terminal 21 may be formed into a certain shape through a stamping or cutting process. As shown in FIG. 3, each of the direct current terminal 31 and the alternating current terminal 21 is stamped to form a plate shape with multiple groove structures. Groove structures of the direct current terminal 31 and the alternating current terminal 21 are distributed in a staggered manner. Then, the alternating current terminal 21 and the first copper layer 22 are stacked and connected through welding, and the direct current terminal 31 and the second copper layer 32 are stacked and connected through welding.

According to this design, overcurrent capabilities of the first copper layer 22 and the second copper layer 32 can be enhanced, to avoid using a thick copper layer, so as to prevent a stress problem. In addition, a spacing between a circuit (direct current positive and negative end circuits) of an alternating current circuit board and a circuit (alternating current end circuit) of a direct current circuit board can be reduced, to enhance mutual coupling, so that a current return path is the closest. An advantage is that a current return inductance is reduced, and a conductive frame including the thick direct current terminal 31 and alternating current terminal 21 can provide a good current equalization effect.

In some embodiments, as shown in FIG. 5, the first bridge arm assembly 2 further includes a first circuit board 24 and an alternating current control terminal 25. The first circuit board 24 is electrically connected between the first chip 23 and the alternating current control terminal 25. The alternating current control terminal 25 extends out of the housing 1. In this way, a control signal generated at the first chip 23 can be transferred to the alternating current control terminal 25 through the first circuit board 24, and then output to the outside of the power supply 100 through the alternating current control terminal 25, to facilitate receiving and obtaining by a worker.

As shown in FIG. 5, the first circuit board 24 has three chip lead-out points, and the three chip lead-out points of the first circuit board 24 are configured to be electrically connected to the three first chips 23 respectively. In addition, the alternating current control terminal 25 may be three spaced signal terminals, and the three signal terminals are respectively T1, G1, and S1. The three signal terminals are spaced in parallel and extend out from an open end of the installation cavity. This facilitates output of the control signal. In some embodiments, the first circuit board 24 may be a flexible circuit board.

Figure 7:
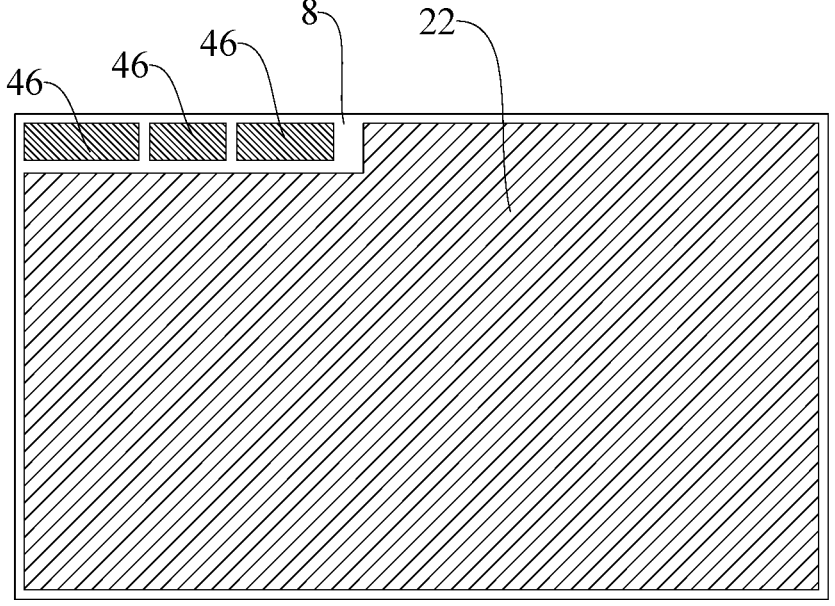
FIG. 7 is a cross-sectional view at an alternating current terminal of a power supply according to an embodiment of the present disclosure.

As shown in FIG. 7, a gap is formed at the edge of the first copper layer 22. A pad 46 of the alternating current control terminal 25 is arranged/disposed at the gap. The pad 46 is divided into three parts. In this way, the three signal terminals can be welded and fastened to the three parts of the pad 46 respectively.

As shown in FIG. 6, the second bridge arm assembly 3 further includes a second circuit board 34 and a direct current control terminal 35. The second circuit board 34 is electrically connected between the second chip 33 and the direct current control terminal 35. The direct current control terminal 35 extends out of the housing 1. In this way, a control signal generated at the second chip 33 can be transferred to the direct current control terminal 35 through the second circuit board 34, and then output to the outside of the power supply 100 through the direct current control terminal 35, to facilitate receiving and obtaining by a worker.

As shown in FIG. 6, the second circuit board 34 has three chip lead-out points, and the three chip lead-out points of the second circuit board 34 are configured to be electrically connected to the three second chips 33 respectively. In addition, the direct current control terminal 35 may be three spaced signal terminals, and the three signal terminals are respectively T2, G2, and S2. The three signal terminals are spaced in parallel and extend out from the open end of the installation cavity. This facilitates output of the control signal. In some embodiments, the second circuit board 34 may be a flexible circuit board.

Figure 8:
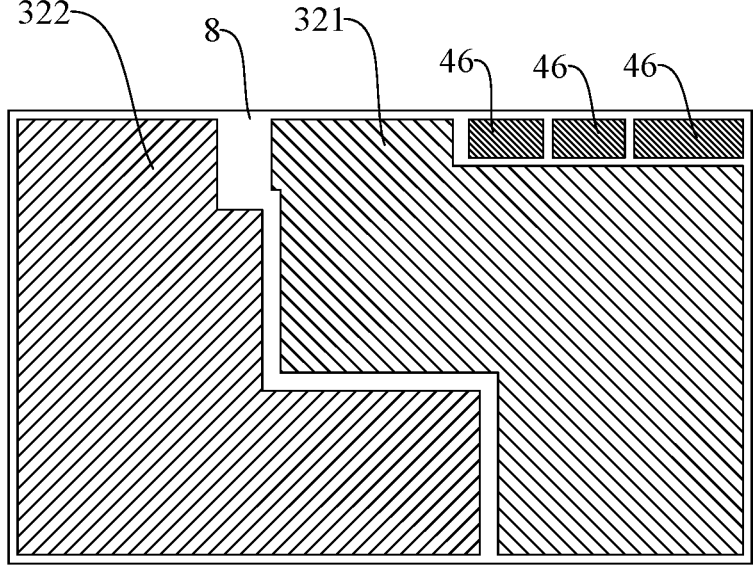
FIG. 8 is a cross-sectional view at a direct current terminal of a power supply according to an embodiment of the present disclosure.
Figure 9:
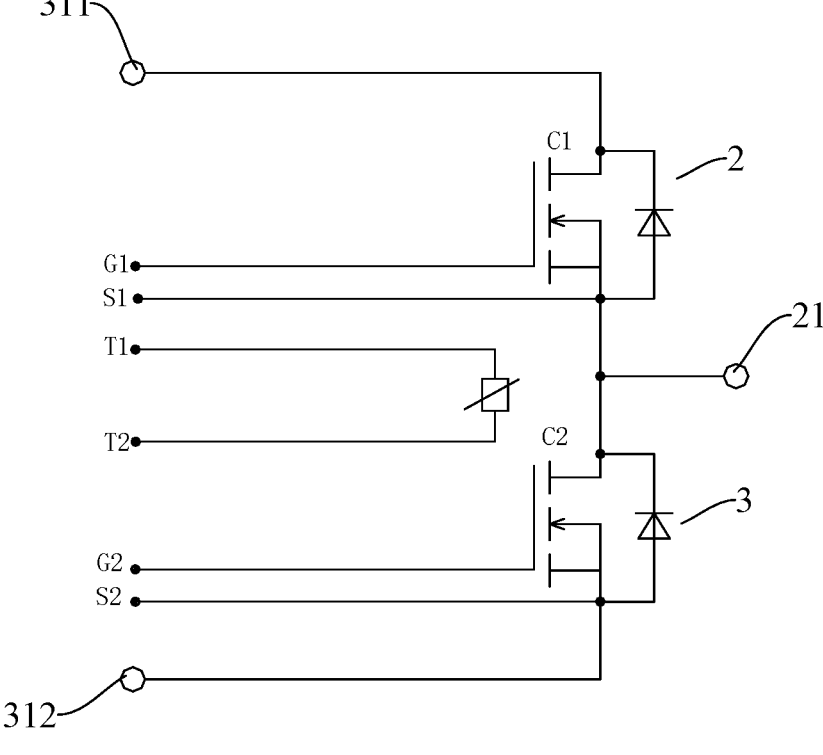
FIG. 9 is a circuit diagram of a power supply according to an embodiment of the present disclosure.

As shown in FIG. 8, the positive copper layer region 321 and the negative copper layer region 322 are spaced apart, and a gap is formed at the edge of the positive copper layer region 321. A pad 46 of the direct current control terminal 35 is arranged at the gap. The pad 46 is divided into three parts. In this way, the three signal terminals can be welded and fastened to the three parts of the pad 46 of the direct current control terminal 35 respectively.

It should be noted that, in some embodiments of the present disclosure, the direct current circuit board and the alternating current circuit board may be flexible circuit boards, so that when connecting a control end and a gate control end of a chip, the flexible circuit board can replace a conventional binding process. In this way, a structural characteristic that the flexible circuit board has a planar structure and has an insulating layer with sufficient strength can be used, and there is no need to reserve a large radian space and insulating spacing for the binding process. In addition, this reduces a module thickness and reduces a stray inductance.

In some embodiments, the alternating current control terminal 25 and the direct current control terminal 35 are a shared control board 41. In other words, in the embodiments, a design with three independent pins is not used for the alternating current control terminal 25 and the direct current control terminal 35, but the same control board 41 is used to output a control signal. In some embodiments, the control board may be flexible control board.

Figure 15:
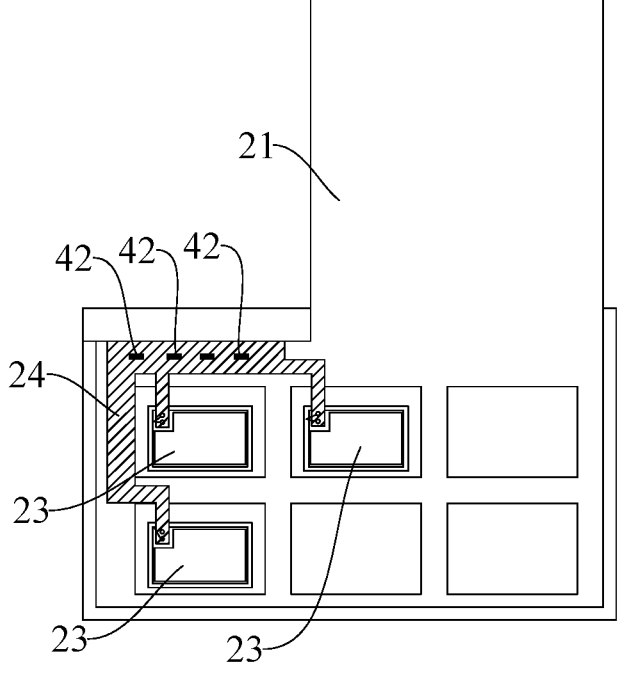
FIG. 15 is a cross-sectional view of a first bridge arm assembly of a power supply according to some embodiments of the present disclosure.
Figures 16, 17:
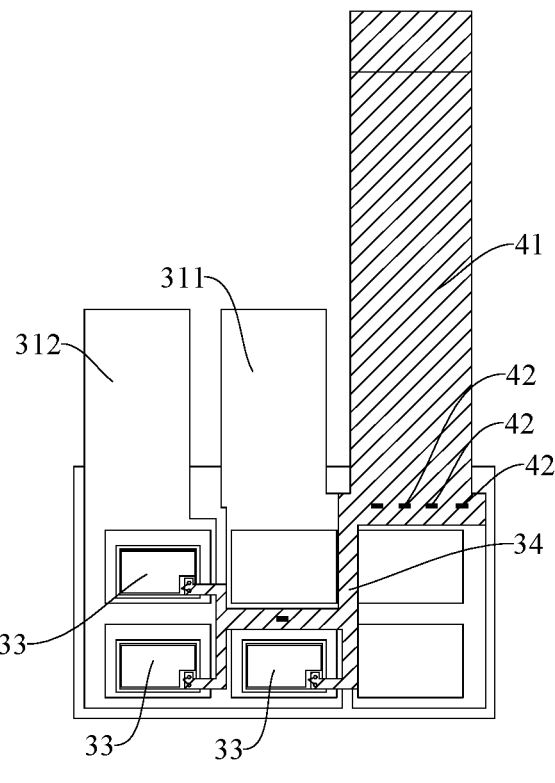
FIG. 16 is a cross-sectional view of a second bridge arm assembly of a power supply according to some embodiments of the present disclosure.
FIG. 17 is a cross-sectional view of a power supply according to a further embodiment of the present disclosure.

In an embodiment, as shown in FIG. 15, four connection points 42 are provided on the first circuit board 24. In addition, as shown in FIG. 16, four connection points 42 are also provided on the second circuit board 34. A shared control board 41 is arranged. Four connection points 42 are correspondingly provided on the control board 41. The four connection points 42 on the control board 41 are respectively connected to the four connection points 42 on the first circuit board 24, and are respectively connected to the four connection points 42 on the second circuit board 34, to output a control signal.

Figure 13:
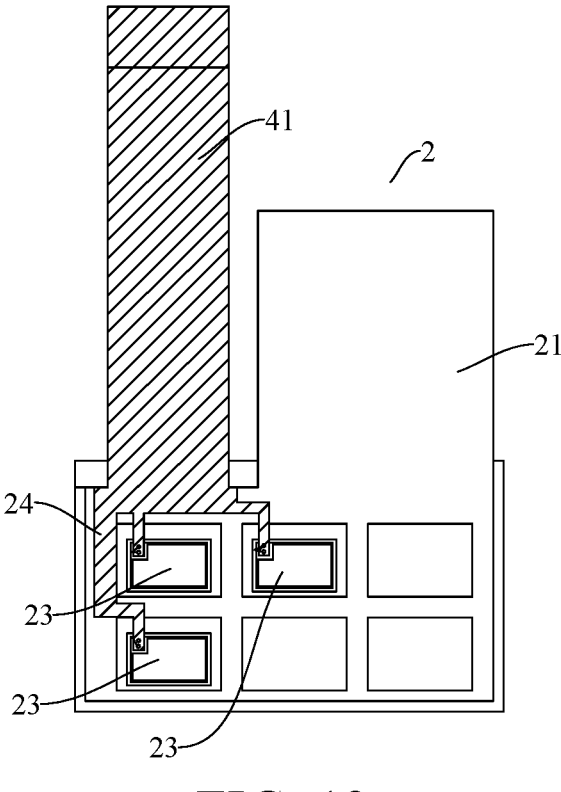
FIG. 13 is a cross-sectional view of a first bridge arm assembly of a power supply according to some embodiments of the present disclosure.
Figure 14:
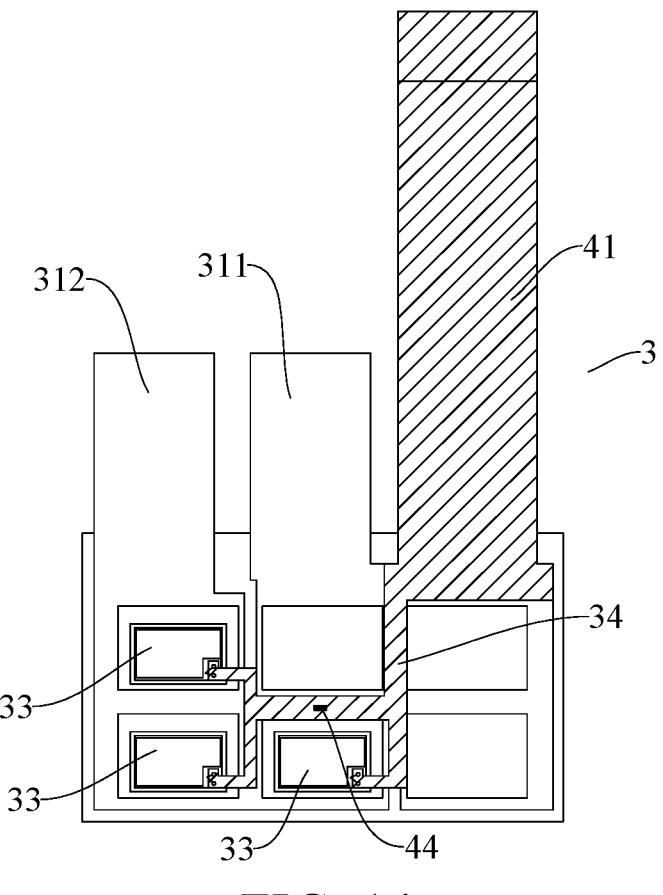
FIG. 14 is a cross-sectional view of a second bridge arm assembly of a power supply according to some embodiments of the present disclosure.

In an embodiment, the alternating current control terminal 25 and the direct current control terminal 35 are separate control boards 41. As shown in FIG. 13, an upper end of the alternating current control terminal 25 extends upward and extends out of the installation cavity. To be specific, an upper end extension part of the alternating current control terminal 25 is a control board 41 corresponding to the alternating current control terminal 25, to output an electrical control signal on the alternating current control terminal 25. In addition, as shown in FIG. 14, an upper end of the direct current control terminal 35 extends upward and extends out of the installation cavity. To be specific, an upper end extension part of the direct current control terminal 35 is a control board 41 corresponding to the direct current control terminal 35, to output an electrical control signal on the direct current control terminal 35.

Therefore, the alternating current control terminal 25 and the direct current control terminal 35 are the control boards 41, to further extend from the circuit boards to the outside of the power supply 100. A design of a control terminal is implemented, and the structure is more compact and a spaced is saved. In addition, an interface position of a drive board is more flexibly set. The control board 41 may perform impedance control on a gate control signal, to provide a channel design for ensuring signal integrity. This cannot be achieved by a pin-type terminal. In addition, it can be ensured that a gate motion signal does not generate distortion such as overshoot or ringing. In other words, reliable turn-off or turn-on of a high-speed component SiC MOSFET can be ensured, and a loss can be reduced.

In some embodiments, as shown in FIG. 17, the direct current terminal 31 includes a positive terminal 311 and a negative terminal 312 that are spaced apart. The second circuit board 34 has a capacitance absorption region 43, and two ends of the capacitance absorption region 43 are electrically connected to the negative terminal 312 and the positive terminal 311 respectively. In this way, arrangement of the capacitance absorption region 43 enables the capacitance absorption region 43 to effectively absorb overshoot energy generated by a stray inductance during a switching action. In addition, a system EMI (electromagnetic interference) problem can be optimized. During the design, a quantity of layers of the capacitance absorption region 43 may be set according to an actual requirement.

Figures 18, 19, 20:
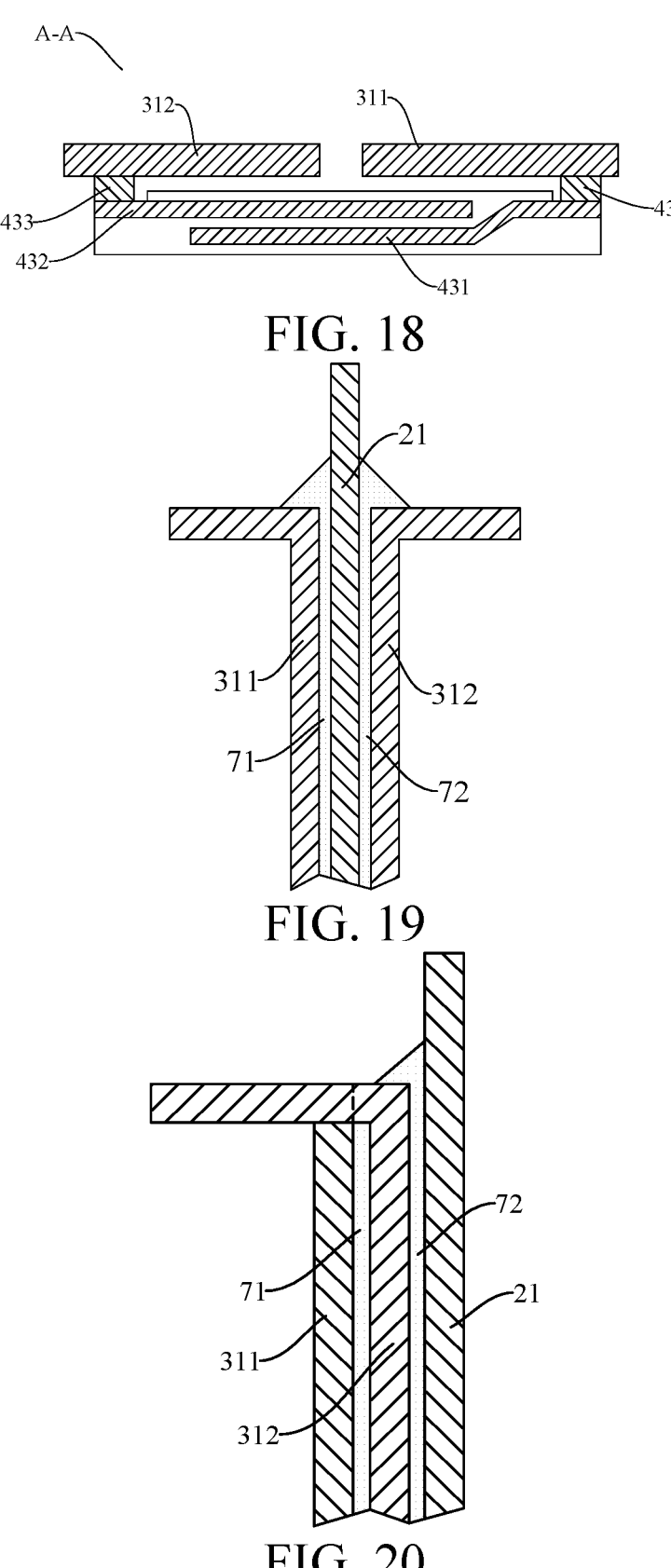
FIG. 18 is a cross-sectional view along A-A in FIG. 17.
FIG. 19 is a cross-sectional view of configuration of a direct current terminal and an alternating current terminal in an embodiment of a power supply according to the present disclosure.
FIG. 20 is a cross-sectional view of configuration of a direct current terminal and an alternating current terminal in an embodiment of a power supply according to the present disclosure.

As shown in FIG. 18, the capacitance absorption region 43 includes a positive capacitance region 431 and a negative capacitance region 432. The positive terminal 311 and the positive capacitance region 431 are welded and connected through a welding block 433, and the negative terminal 312 and the negative capacitance region 432 are welded and connected through a welding block 433. The positive capacitance region 431 corresponding to the positive terminal 311 and the negative capacitance region 432 corresponding to the negative terminal 312 are distributed in a stacked manner (e.g., stacked on each other), to further restrict a turn-off peak, reduce a loop, and reduce EMI (electromagnetic interference).

In some embodiments, a temperature sensor 44 is arranged/disposed on the first circuit board 24 and/or the second circuit board 34. As shown in FIG. 5, the temperature sensor 44 is designed on the first circuit board 24, to detect a temperature of the first circuit board 24 through the temperature sensor 44. In an embodiment, a hollow design is used in the first circuit board 24, to install the temperature sensor 44 in a hollow region of the first circuit board 24 to fasten the temperature sensor 44. Similarly, as shown in FIG. 6, the temperature sensor 44 is designed on the second circuit board 34, to detect a temperature of the second circuit board 34 through the temperature sensor 44. In an embodiment, a hollow design is used in the second circuit board 34, to install the temperature sensor 44 in a hollow region of the second circuit board 34 to fasten the temperature sensor 44. In an embodiment, the temperature sensor 44 may be designed on each of the first circuit board 24 and the second circuit board 34, to separately detect temperatures of the two circuit boards.

In some embodiments, the direct current terminal 31 includes the positive terminal 311 and the negative terminal 312. A projection of each of the positive terminal 311 and the negative terminal 312 on the plane on which the alternating current terminal 21 is located at least partially overlaps the alternating current terminal 21. In other words, in a thickness direction of the alternating current terminal 21, the positive terminal 311 and the negative terminal 312 are distributed opposite the alternating current terminal 21. In this way, after the positive terminal 311, the negative terminal 312, and the alternating current terminal 21 are oppositely distributed/disposed, a stray inductance of the terminal can be reduced. In an embodiment, according to this design, the positive terminal 311, the negative terminal 312, and the alternating current terminal 21 can be closely attached to provide a closest return path for a current, and a commutated current between positive and negative electrodes can induct a reverse current on the closely attached alternating current terminal 21 to reduce an inductance of a commutating circuit, so that a stray inductance is effectively reduced.

It should be noted that, during the installation, the positive terminal 311, the negative terminal 312, and the alternating current terminal 21 may be arranged in multiple manners, and each manner can reduce a stray inductance.

In some embodiments, as shown in FIG. 2, both the positive terminal 311 and the negative terminal 312 are stacked on a first side of the insulating member 7. The positive terminal 311 and a part of the insulating member 7 are stacked. The negative terminal 312 and another part of the insulating member 7 are stacked. The alternating current terminal 21 is stacked on a second side of the insulating member 7. In other words, both the positive terminal 311 and the negative terminal 312 are located on the same side of the insulating member 7, and the alternating current terminal 21 is located on another side of the insulating member 7. In this way, the two direct current terminals 31, the positive terminal 311 and the negative terminal 312, and the alternating current terminal 21 are respectively arranged on two sides of the insulating member 7, so that a stacked configuration of the direct current terminal 31 and the alternating current terminal 21 can be achieved. This reduces a stray inductance.

In an embodiment, in some embodiments, the insulating member 7 includes a first insulating layer 71 and a second insulating layer 72. The positive terminal 311 is located on a first side of the alternating current terminal 21. The first insulating layer 71 is arranged between the positive terminal 311 and the alternating current terminal 21. The negative terminal 312 is located on a second side of the alternating current terminal 21. The second insulating layer 72 is arranged between the negative terminal 312 and the alternating current terminal 21. Positions of the positive terminal 311 and the negative terminal 312 may be interchanged for installation.

During design, as shown in FIG. 19, the first insulating layer 71 and the second insulating layer 72 are spaced apart. The positive terminal 311 may be arranged on a left side of the alternating current terminal 21, and the negative terminal 312 may be arranged on a right side of the alternating current terminal 21. In addition, the first insulating layer 71 is arranged between the positive terminal 311 and the alternating current terminal 21 to implement insulative spacing. The second insulating layer 72 is arranged between the negative terminal 312 and the alternating current terminal 21 to implement insulative spacing. In this way, a stacked configuration of the direct current terminal 31 and the alternating current terminal 21 can be achieved. This reduces a stray inductance.

In an embodiment, in some embodiments, the insulating member 7 includes a first insulating layer 71 and a second insulating layer 72. As shown in FIG. 20, the positive terminal 311, the negative terminal 312, and the alternating current terminal 21 are sequentially distributed. For example, the positive terminal 311 is located on the leftmost side, the alternating current terminal 21 is located on the rightmost side, and the negative terminal 312 is located between the positive terminal 311 and the alternating current terminal 21. In addition, the first insulating layer 71 is arranged between the positive terminal 311 and the negative terminal 312, and the second insulating layer 72 is arranged between the negative terminal 312 and the alternating current terminal 21. In other words, the positive terminal 311, the first insulating layer 71, the negative terminal 312, the second insulating layer 72, and the alternating current terminal 21 are sequentially stacked. In this way, a stacked configuration of the direct current terminal 31 and the alternating current terminal 21 can be achieved. This reduces a stray inductance.

In an embodiment, the negative terminal 312, the positive terminal 311, and the alternating current terminal 21 may be sequentially distributed. For example, the negative terminal 312 is located on the leftmost side, the alternating current terminal 21 is located on the rightmost side, and the positive terminal 311 is located between the negative terminal 312 and the alternating current terminal 21. In addition, the first insulating layer 71 is arranged between the negative terminal 312 and the positive terminal 311, and the second insulating layer 72 is arranged between the positive terminal 311 and the alternating current terminal 21. In other words, the negative terminal 312, the first insulating layer 71, 2 the positive terminal 311, the second insulating layer 72, and the alternating current terminal 21 are sequentially stacked. In this way, a stacked configuration of the direct current terminal 31 and the alternating current terminal 21 can be achieved. This reduces a stray inductance.

Figure 21:
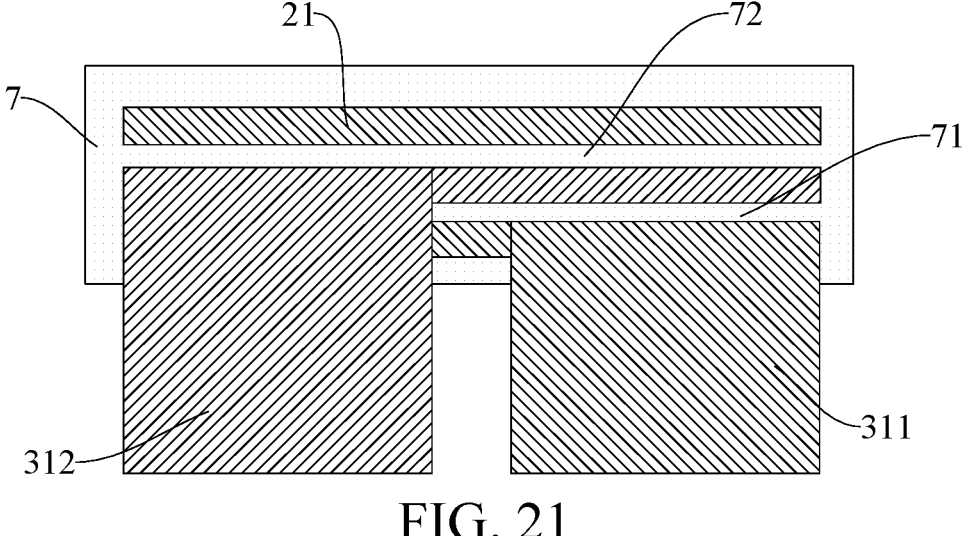
FIG. 21 is a cross-sectional view of configuration of a direct current terminal and an alternating current terminal from another perspective of the power supply in the embodiment in FIG. 20.

During design, as shown in FIG. 21, the insulating member 7 may have three installation slots. The three installation slots are sequentially distributed in a thickness direction of the insulating member 7. The alternating current terminal 21 is installed in the first installation slot. The negative terminal 312 has a negative plugging part, and the negative plugging part is plugged into a middle installation slot. The positive terminal 311 has a positive plugging part, and the positive plugging part is plugged into the other installation slot. Therefore, an insulating part between the first installation slot and the middle installation slot is the second insulating layer 72, and an insulating part between the middle installation slot and the other installation slot is the first insulating layer 71.

In other words, the alternating current terminal 21, the positive terminal 311, and the negative terminal 312 in the present disclosure may cooperate/couple with the insulating member 7 in multiple forms, and each form can implement a stacked coupling between the direct current terminal 31 and the alternating current terminal 21, that is, each form can reduce a stray inductance.

In some embodiments, as shown in FIG. 19 or FIG. 20, an overall extension length of the alternating current terminal is greater than an overall extension length of the direct current terminal 31. In this way, it can be ensured that the direct current terminal 31 obtains a whole-process magnetic field cancellation function. A part of the alternating current terminal 21 that falls outside a plastic package provides an electrical connection point. The direct current terminal 31 may be polished after injection molding, to expose an electrical connection surface, or may be molded at a time through a particular mold design. A protrusion made of an insulating material is arranged between the positive terminal 311 and the negative terminal 312 to ensure a sufficient creepage distance.

Figure 10:
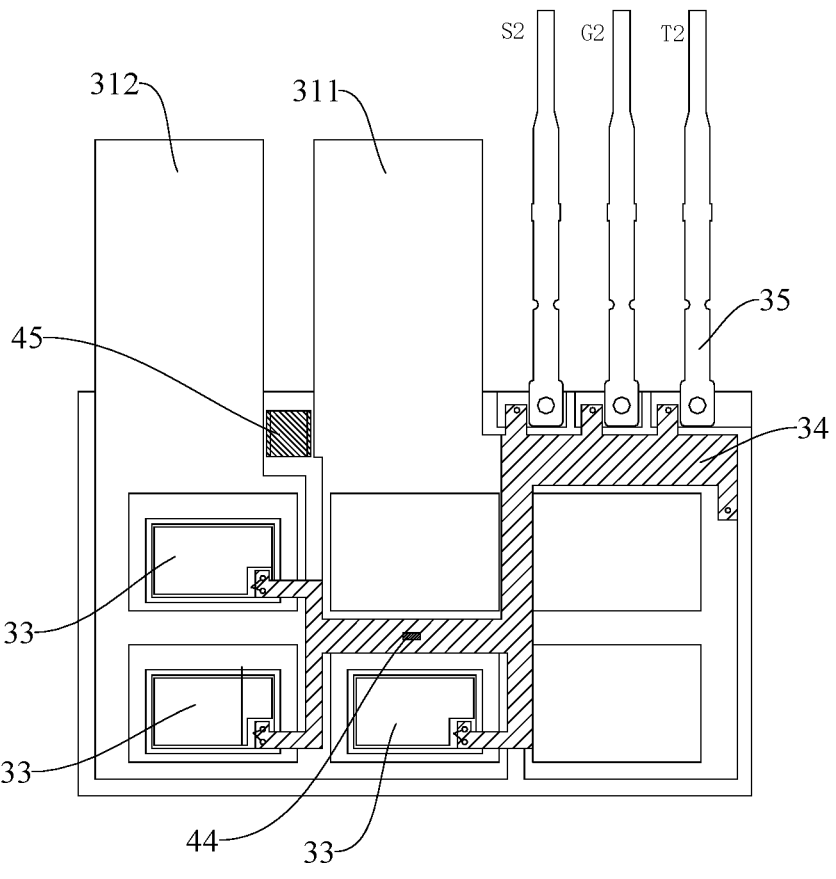
FIG. 10 is a cross-sectional view of a first bridge arm assembly of a power supply according to some embodiments of the present disclosure.
Figure 11:
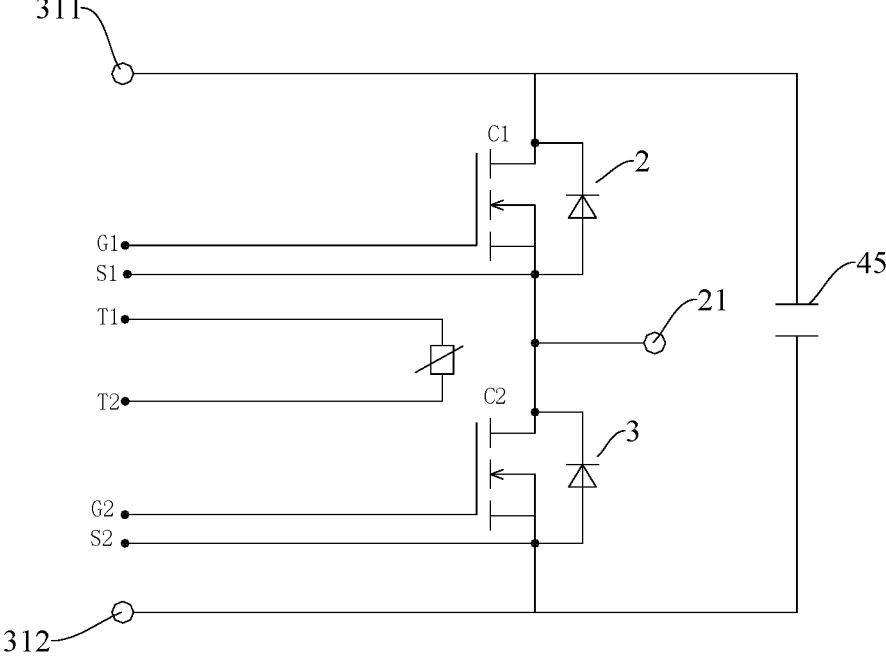
FIG. 11 is a circuit diagram of a power supply according to some embodiments of the present disclosure.
Figure 12:
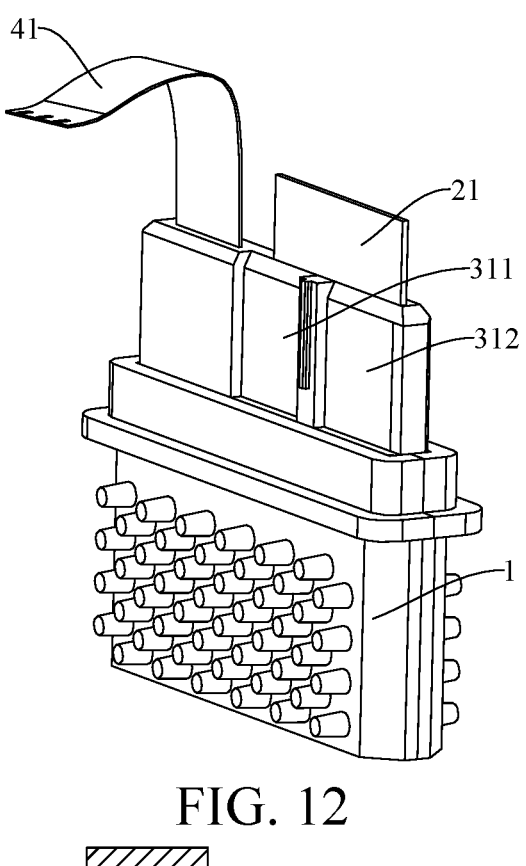
FIG. 12 is a schematic structural diagram of a power supply according to some embodiments of the present disclosure.

In some embodiments, as shown in FIG. 10, the direct current terminal 31 includes the positive terminal 311 and the negative terminal 312. An absorption capacitor 45 is arranged between the positive terminal 311 and the negative terminal 312, so that the absorption capacitor 45 absorbs overshoot energy generated by a stray inductance during a switching action. In addition, a system EMI (electromagnetic interference) problem can be optimized.

It should be noted that, the power supply 100 in the present disclosure may be processed and molded through the following process:

The first chip 23, the second chip 33, the first circuit board 24, the second circuit board 34, the housing 1, the alternating current control terminal 25, the direct current control terminal 35, the alternating current terminal 21, the positive terminal 311, the negative terminal 312, the first pad block 51, and the second pad block 61 are first welded through silver sintering or a conventional brazing process. Then, the pad, the first chip 23, and the second chip 33 are positioned. A GS electrode of the chip is led out through a process such as ultrasonic welding, soldering, or brazing. In addition, the same processing is performed for welding between the first circuit board 24, the second circuit board 34, and the pad.

In addition, at where the first circuit board 24 and the second circuit board 34 are electrically connected, for example, the temperature sensor in some embodiments of the present disclosure needs two circuit boards to form a loop, pads are arranged at corresponding positions on the first circuit board 24 and the second circuit board 34, and an elastic material is padded at the bottom of a pad on one of the circuit boards, to ensure that an initial crimping force is provided after snap-fit between the first copper layer 22 and the second copper layer 32, so as to ensure reliable contact during welding. The first copper layer 22 and the second copper layer 32 are first respectively bonded to the two sub-housings 11 through a low-temperature eutectic process. In this way, production of the first bridge arm assembly 2 and the second bridge arm assembly 3 is completed. Then, solder is painted on a contact surface between the housing 1 and each of the first bridge arm assembly 2 and the second bridge arm assembly 3 and a welding surface between the ceramic layer 8 and each of the two pad blocks. After snap-fit between the first bridge arm assembly 2 and the second bridge arm assembly 3, housing sealing and internal electrical connection are completed through a process such as reflow soldering. Then, thermosetting resin is poured, so that production of the power supply 100 is completed.

The present disclosure further provides an electrical device, which includes the power supply 100 according to any of the foregoing embodiments. Arranging the power supply 100 can effectively resolve a problem that a stray inductance is large, so that operation accuracy of the power supply 100 is improved.

In the description of the present disclosure, it should be understood that orientation or position relationships indicated by the terms such as "center", "longitudinal", "transverse", "length", "width", "thickness", "above", "below", "front", "back", "left", "right", "vertical", "horizontal", "top", "bottom", "inside", "outside", "clockwise", "anti-clockwise", "axial direction", "radial direction", and "circumferential direction" are based on orientation or position relationships shown in the accompanying drawings, and are merely used for ease and brevity of description of the present disclosure, rather than indicating or implying that the indicated apparatus or element needs to have a particular orientation or needs to be constructed and operated in a particular orientation. Therefore, such terms should not be construed as a limitation on the present disclosure.

In the description of the present disclosure, a "first feature" or "second feature" may include one or more of the features.

In the description of the present disclosure, "multiple" means two or more.

In the description of the present disclosure, that a first feature is "above" or "below" a second feature may include that the first and second features are in direct contact, or may include that the first and second features are not in direct contact but are in contact by using other features therebetween.

In the description of the present disclosure, that a first feature is "above", "over", or "on" a second feature includes that the first feature is right above and on the inclined top of the second feature or merely indicates that a level of the first feature is higher than that of the second feature.

In the description of this specification, descriptions using reference terms "an embodiment", "some embodiments", "an example embodiment", "an example", "a specific example", or "some examples" mean that features, structures, materials, or characteristics described with reference to the embodiment or example are included in at least one embodiment or example of the present disclosure. In this specification, example descriptions of the foregoing terms do not necessarily refer to the same embodiment or example. In addition, the described features, structures, materials, or characteristics may be combined in a proper manner in any one or more embodiments or examples.

Although embodiments of the present disclosure have been shown and described, a person of ordinary skill in the art should understand that various changes, modifications, replacements, and variations may be made to the embodiments without departing from the principle and purpose of the present disclosure, and the scope of the present disclosure is defined by the claims and their equivalents.

What is claimed is:

1. A power supply, comprising:
a housing; and
a first bridge arm assembly and a second bridge arm assembly disposed in the housing, and an insulating member disposed between the first bridge arm assembly and the second bridge arm assembly, wherein
the first bridge arm assembly has an alternating current terminal, the second bridge arm assembly has a direct current terminal, a projection of the alternating current terminal on a plane on which the direct current terminal is located at least partially overlaps the direct current terminal, and at least a part of the insulating member is disposed between the alternating current terminal and the direct current terminal.

2. The power supply according to claim 1, wherein
the first bridge arm assembly further comprises a first copper layer and a first chip, a projection of the first copper layer on a plane on which the alternating current terminal is located at least partially overlaps the alternating current terminal, and the first chip is disposed in the alternating current terminal and faces the first copper layer; and
the second bridge arm assembly further comprises a second copper layer and a second chip, a projection of the second copper layer on the plane on which the direct current terminal is located at least partially overlaps the direct current terminal, and the second chip is disposed in the direct current terminal and faces the second copper layer.

3. The power supply according to claim 2, further comprising
a first pad block disposed between the first chip and the second copper layer, wherein adjacent two of the first copper layer, the first chip, the first pad block, and the second copper layer are welded by a first welding layer; and
a second pad block disposed between the second chip and the first copper layer, wherein adjacent two of the second copper layer, the second chip, the second pad block, and the first copper layer are welded by a second welding layer.

4. The power supply according to claim 2, wherein each of the direct current terminal and the alternating current terminal comprises a platelike structure, the alternating current terminal is connected to the first copper layer, and the direct current terminal is connected to the second copper layer.

5. The power supply according to claim 2, wherein
the first bridge arm assembly further comprises a first circuit board and an alternating current control terminal, the first circuit board is electrically connected between the first chip and the alternating current control terminal, and the alternating current control terminal extends out of the housing; and
the second bridge arm assembly further comprises a second circuit board and a direct current control terminal, the second circuit board is electrically connected between the second chip and the direct current control terminal, and the direct current control terminal extends out of the housing.

6. The power supply according to claim 5, wherein the alternating current control terminal and the direct current control terminal are integrated as a control board.

7. The power supply according to claim 5, wherein each of the alternating current control terminal and the direct current control terminal comprises a control board.

8. The power supply according to claim 5, wherein the direct current terminal comprises a positive terminal and a negative terminal spaced apart, the second circuit board has a capacitance absorption region, and two ends of the capacitance absorption region are electrically connected to the negative terminal and the positive terminal respectively.

9. The power supply according to claim 5, wherein a temperature sensor is disposed on the first circuit board and/or the second circuit board.

10. The power supply according to claim 1, wherein the direct current terminal comprises a positive terminal and a negative terminal spaced apart, and a projection of each of the positive terminal and the negative terminal on a plane on which the alternating current terminal is located at least partially overlaps the alternating current terminal.

11. The power supply according to claim 10, wherein the positive terminal and the negative terminal are located on a first side of the insulating member, the positive terminal is located on a first part of the insulating member, the negative terminal is located on a second part of the insulating member, and the alternating current terminal is located on a second side of the insulating member.

12. The power supply according to claim 10, wherein the insulating member comprises a first insulating layer and a second insulating layer, wherein
the positive terminal is located on a first side of the alternating current terminal, the first insulating layer is disposed between the positive terminal and the alternating current terminal, the negative terminal is located on a second side of the alternating current terminal, and the second insulating layer is disposed between the negative terminal and the alternating current terminal.

13. The power supply according to claim 10, wherein the insulating member comprises a first insulating layer and a second insulating layer, wherein the positive terminal, the first insulating layer, the negative terminal, the second insulating layer, and the alternating current terminal are sequentially disposed; or the negative terminal, the first insulating layer, the positive terminal, the second insulating layer, and the alternating current terminal are sequentially disposed.

14. The power supply according to claim 1, wherein the direct current terminal and the alternating current terminal extend out from a side of the housing, and an extension length of the alternating current terminal is greater than an extension length of the direct current terminal.

15. The power supply according to claim 1, wherein the direct current terminal comprises a positive terminal and a negative terminal, and an absorption capacitor is disposed between the positive terminal and the negative terminal.

16. An electrical device, comprising a power supply, the power supply comprising:

a housing; and a first bridge arm assembly and a second bridge arm assembly disposed in the housing, and an insulating member disposed between the first bridge arm assembly and the second bridge arm assembly, wherein the first bridge arm assembly has an alternating current terminal, the second bridge arm assembly has a direct current terminal, a projection of the alternating current terminal on a plane on which the direct current terminal is located at least partially overlaps the direct current terminal, and at least a part of the insulating member is disposed between the alternating current terminal and the direct current terminal.

17. The electrical device according to claim 16, wherein the first bridge arm assembly further comprises a first copper layer and a first chip, a projection of the first copper layer on a plane on which the alternating current terminal is located at least partially overlaps the alternating current terminal, and the first chip is disposed in the alternating current terminal and faces the first copper layer; and the second bridge arm assembly further comprises a second copper layer and a second chip, a projection of the second copper layer on the plane on which the direct current terminal is located at least partially overlaps the direct current terminal, and the second chip is disposed in the direct current terminal and faces the second copper layer.

18. The electrical device according to claim 17, wherein the power supply comprises:

a first pad block disposed between the first chip and the second copper layer, wherein adjacent two of the first copper layer, the first chip, the first pad block, and the second copper layer are welded by a first welding layer; and a second pad block disposed between the second chip and the first copper layer, wherein adjacent two of the second copper layer, the second chip, the second pad block, and the first copper layer are welded by a second welding layer.

19. The electrical device according to claim 17, wherein each of the direct current terminal and the alternating current terminal comprises a platelike structure, the alternating current terminal is connected to the first copper layer, and the direct current terminal is connected to the second copper layer.

20. The electrical device according to claim 17, wherein the first bridge arm assembly further comprises a first circuit board and an alternating current control terminal, the first circuit board is electrically connected between the first chip and the alternating current control terminal, and the alternating current control terminal extends out of the housing; and the second bridge arm assembly further comprises a second circuit board and a direct current control terminal, the second circuit board is electrically connected between the second chip and the direct current control terminal, and the direct current control terminal extends out of the housing.

* * * * *